US007230437B2

(12) United States Patent
Eldridge et al.

(10) Patent No.: US 7,230,437 B2
(45) Date of Patent: Jun. 12, 2007

(54) MECHANICALLY RECONFIGURABLE VERTICAL TESTER INTERFACE FOR IC PROBING

(75) Inventors: Benjamin N. Eldridge, Danville, CA (US); Barbara Vasquez, Lafayette, CA (US); Makarand S. Shinde, Dublin, CA (US); Gaetan L. Mathieu, Livermore, CA (US); A. Nicholas Sporck, Saratoga, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/868,425

(22) Filed: Jun. 15, 2004

(65) Prior Publication Data

US 2005/0277323 A1    Dec. 15, 2005

(51) Int. Cl.
*G01R 13/02* (2006.01)
(52) U.S. Cl. ..................................................... 324/754
(58) Field of Classification Search ................ 439/482; 324/754, 757, 761
See application file for complete search history.

(56) References Cited

U.S. PATENT DOCUMENTS

| | | | | |
|---|---|---|---|---|
| 4,038,599 A | * | 7/1977 | Bove et al. ................... 324/754 |
| 4,087,747 A | * | 5/1978 | Deegen et al. ............. 324/72.5 |
| 4,471,298 A | * | 9/1984 | Frohlich ..................... 324/72.5 |
| 4,713,014 A | * | 12/1987 | Conroy-Wass ................ 439/67 |
| 5,476,211 A | | 12/1995 | Khandros ................. 228/180.5 |
| 5,525,912 A | * | 6/1996 | Momohara .................. 324/754 |
| 5,534,784 A | * | 7/1996 | Lum et al. ................... 324/757 |
| 5,555,422 A | * | 9/1996 | Nakano ....................... 324/754 |
| 5,669,775 A | * | 9/1997 | Campbell et al. .............. 439/77 |
| 5,804,983 A | * | 9/1998 | Nakajima et al. ........... 324/758 |
| 5,828,223 A | * | 10/1998 | Rabkin et al. ............... 324/754 |
| 5,974,662 A | * | 11/1999 | Eldridge et al. ............... 29/842 |
| 6,150,830 A | * | 11/2000 | Schmid et al. .............. 324/761 |
| 6,268,015 B1 | | 7/2001 | Mathieu et al. ............... 427/96 |
| 6,482,013 B2 | | 11/2002 | Eldridge et al. .............. 439/66 |
| 6,509,751 B1 | | 1/2003 | Mathieu et al. ............. 324/754 |
| 6,762,599 B1 | * | 7/2004 | Miller ..................... 324/158.1 |
| 6,784,678 B2 | * | 8/2004 | Pietzschmann ............. 324/758 |

OTHER PUBLICATIONS

U.S. Appl. No. 09/527,931, filed Mar. 17, 200, Grube et al.

\* cited by examiner

*Primary Examiner*—Neil Abrams
(74) *Attorney, Agent, or Firm*—N. Kenneth Burraston

(57) ABSTRACT

A wafer test assembly includes multiple probe head substrates arranged like tiles with connectors attached to one side and probes supported on the opposing side. In one embodiment, flexible cable connectors directly connect the connectors on the probe head tile to a test head, while in another embodiment the flexible cables connect the probe head tile to a PCB providing horizontal routing to test head connectors. In one embodiment, leveling pins provide a simplified support structure connecting to a retaining element attached to the tiles to provide for applying a push-pull leveling force. A test head connector interface frame enables rearrangement of connectors between the test head and the probe card to provide for both full wafer contact or partial wafer contact. The test head connectors are rearranged by being slidable on rails, and unpluggable using pins, enabling movement over a range of positions.

19 Claims, 9 Drawing Sheets

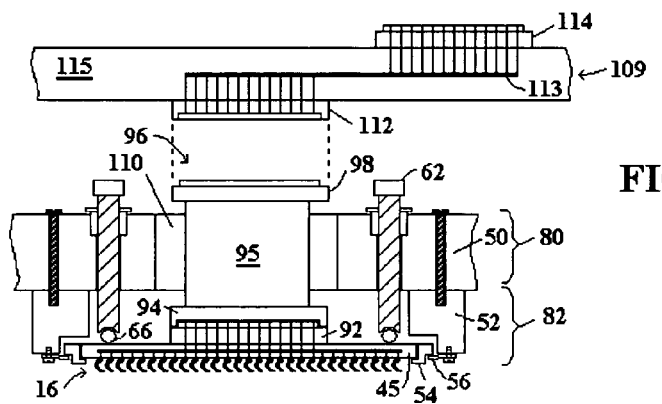
FIG. 9A
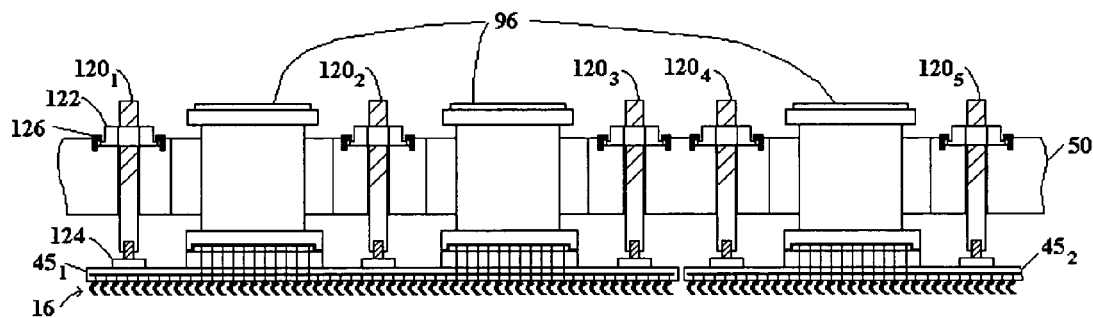
FIG. 9B
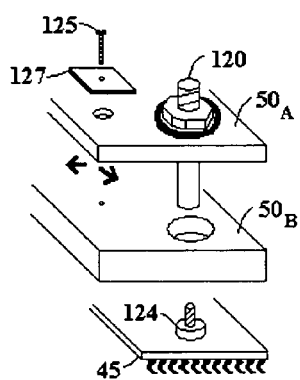 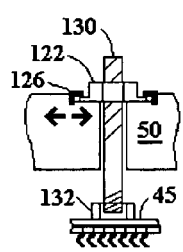 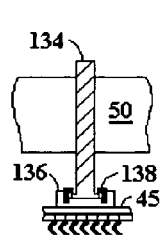 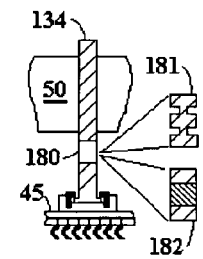
FIG. 10A  FIG. 10B  FIG. 10C  FIG. 10D

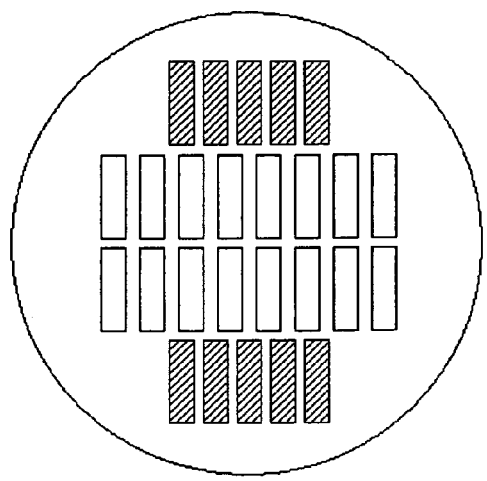
FIG. 13A
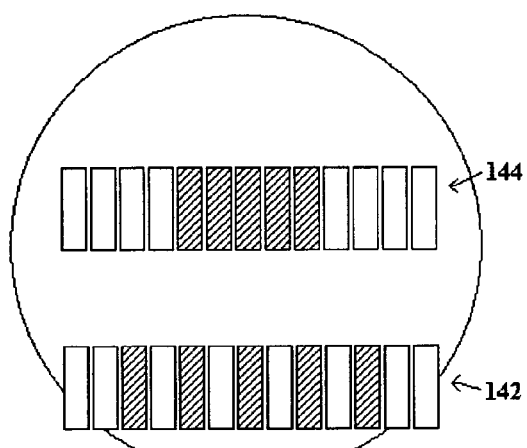
STEP A
FIG. 13B
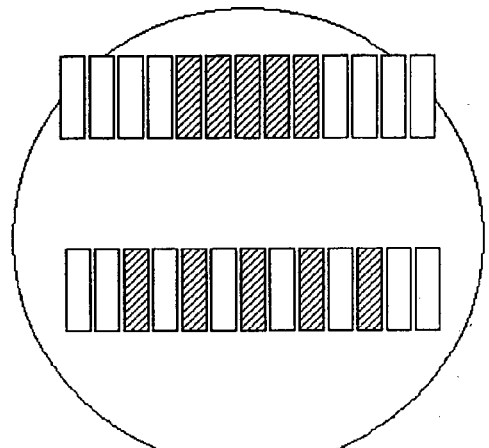
STEP B
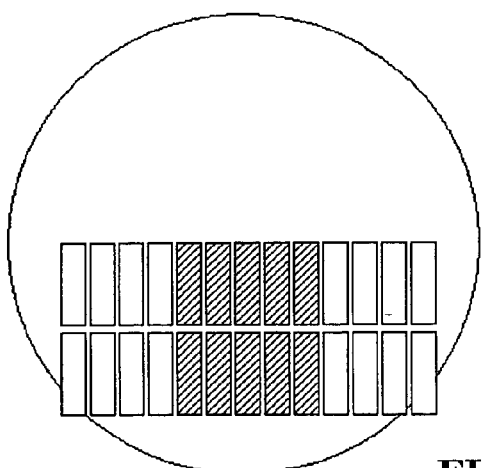
STEP A
FIG. 13C
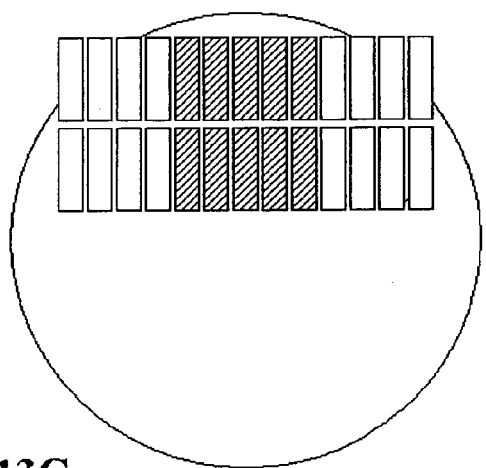
STEP B

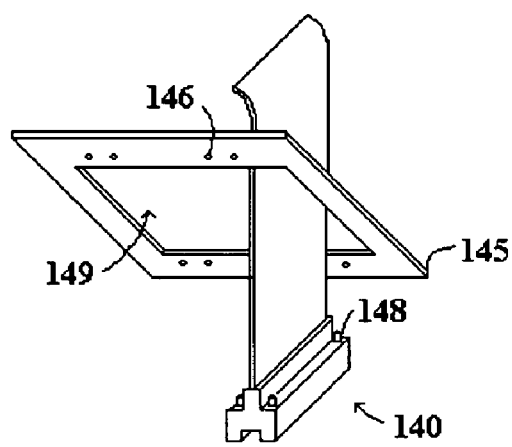
FIG. 14A
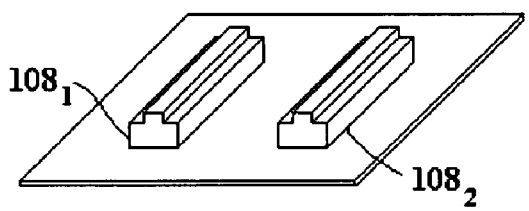
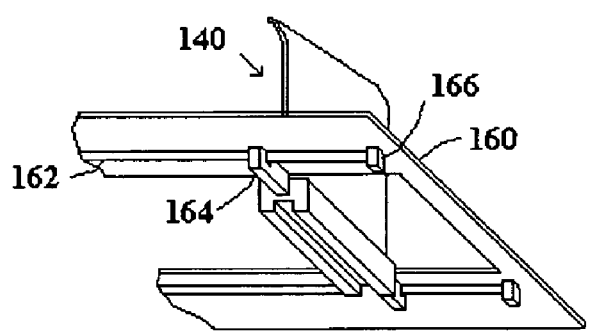
FIG. 14B
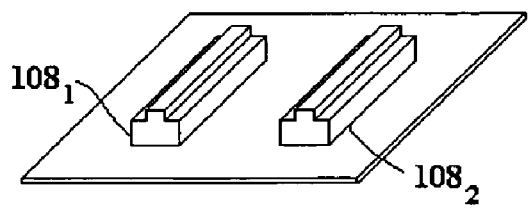

MECHANICALLY RECONFIGURABLE VERTICAL TESTER INTERFACE FOR IC PROBING

BACKGROUND

1. Technical Field

The present invention relates in general to a configuration of a test system for testing integrated circuits (ICs) on a wafer. More particularly, the present invention relates to the configuration of components of a probe card used in the wafer test system.

2. Related Art

When building semiconductor wafer contactor test systems, a major obstacle is the resource restrictions of a wafer tester. The tester typically does not have enough resources or test channels to test all Devices Under Test (DUT) on a wafer. Because of the variety of numbers of DUTs on wafers, a given tester will likely be used both as a full wafer contact probe type interface, and an interface which contacts a portion of the wafer, referred to as a partial wafer probe.

With an increased number of test channels, as well as increased size of wafers and the number of DUTs on a wafer, it becomes more desirable to modify the probe card for connecting the tester to a wafer to enable testing more ICs at one time in a low cost efficient manner. Larger probe cards are desired with more probes to connect to and test more DUTs at one time. Even with smaller sized wafers, it was desirable for probe cards to support more probes so that all DUTs on a wafer can be tested with less touch downs of the probe card. The added probes on a probe card, however, result in more complex routing of electrical lines, and more complex systems for alignment of the probe card relative to a wafer being tested.

FIG. 1 shows a block diagram of a test system using a probe card for testing DUTs on a semiconductor wafer. The test system includes a test controller 4 connected by a communication cable 6 to a test head 8. The test system further includes a prober 10 made up of a stage 12 for mounting a wafer 14 being tested, the stage 12 being movable to contact the wafer 14 with probes 16 on a probe card 18. The prober 10 includes the probe card 18 supporting probes 16 which contact DUTs formed on the wafer 14.

In the test system, test data is generated by the test controller 4 and transmitted through the communication cable 6, test head 8, probe card 18, probes 16 and ultimately to DUTs on the wafer 14. Test results are then provided from DUTs on the wafer back through the probe card 18 to the test head 8 for transmission back to the test controller 4. Once testing is complete, the wafer is diced up to separate the DUTs.

Test data provided from the test controller 4 is divided into the individual tester channels provided through the cable 6 and separated in the test head 8 so that each channel is carried to a separate one of the probes 16. The channels from the test head 8 are linked by connectors 24 to the probe card 18. The probe card 18 then links each channel to a separate one of the probes 16.

FIG. 2 shows a cross sectional view of components of the probe card 18. The probe card 18 is configured to provide both electrical pathways and mechanical support for the spring probes 16 that will directly contact the wafer. The probe card electrical pathways are provided through a printed circuit board (PCB) 30, an interposer 32, and a space transformer 34. Test data from the test head 8 is provided through pogo pins or zero insertion force (ZIF) connectors 24 typically connected around the periphery of the PCB 30. Channel transmission lines 40 distribute signals from the tester interface connectors (pogo or ZIF) 24 horizontally in the PCB 30 to contact pads on the PCB 30 to match the routing pitch of pads on the space transformer 34. The interposer 32 includes a substrate 42 with spring probe electrical contacts 44 disposed on both sides. The interposer 32 electrically connects individual pads on the PCB 30 to pads forming a land grid array (LGA) on the space transformer 34. The LGA pad connections are typically arranged in a regular multi-row pattern. Transmission lines 46 in a substrate 45 of the space transformer 34 distribute or "space transform" signal lines from the LGA to spring probes 16 configured in an array. The space transformer substrate 45 is typically constructed from either multi-layered ceramic or organic based laminates. The space transformer substrate 45 with embedded circuitry, probes and LGA is referred to as a probe head.

Mechanical support for the electrical components is provided by a back plate 50, bracket (Probe Head Bracket) 52, frame (Probe Head Stiffener Frame) 54, leaf springs 56, and leveling pins 62. The back plate 50 is provided on one side of the PCB 30, while the bracket 52 is provided on the other side and attached by screws 59. The leaf springs 56 are attached by screws 58 to the bracket 52. The leaf springs 56 extend to movably hold the frame 54 within the interior walls of the bracket 52. The frame 54 then includes horizontal extensions 60 for supporting the space transformer 34 within its interior walls. The frame 54 surrounds the probe head and maintains a close tolerance to the bracket 52 such that lateral motion is limited.

Leveling pins 62 complete the mechanical support for the electrical elements and provide for leveling of the space transformer 34. The leveling pins 62 are adjusted so that brass spheres 66 provide a point contact with the space transformer 34. The spheres 66 contact outside the periphery of the LGA of the space transformer 34 to maintain isolation from electrical components. Leveling of the substrate is accomplished by precise adjustment of these spheres through the use of advancing screws 62, referred to as the leveling pins. Leveling pins 62 are adjustable to level the space transformer 34 and assure all the probes 16 will make contact with a wafer. The leveling pins 62 are screwed through supports 65 in the back plate 50. Motion of the leveling pin screws 62 is opposed by leaf springs 56 so that spheres 66 are kept in contact with the space transformer 34. The leaf springs 56 are designed to be much stronger than the interposer 32, so that raising and lowering the leveling screws 62 is opposed by the leaf springs 56 and the springs 42 and 44 of the interposer 32 serve only to assure electrical contact is maintained between the space transformer 34 as it moves relative to the PCB.

FIG. 3 shows an exploded assembly view of components of the probe card of FIG. 2. FIG. 3 shows attachment of the back plate 50, PCB 30, and bracket 52 using two screws 59. Four leveling screws 62, are provided through the back plate 50 and PCB 30 to contact four spheres 66 near the corners of the space transformer substrate 34. The frame 54 is provided directly over the space transformer substrate 34, the frame 54 fitting inside the bracket 52. The leaf springs 56 are attached by screws 58 to the bracket 52. Two screws 58 are shown for reference, although additional screws 58 (not shown) are provided around the entire periphery to attach the leaf springs.

FIG. 4 shows a perspective view of the opposing side of PCB 30 illustrating the arrangement of connectors 24 around its periphery. In FIG. 3, the connectors 24 of the PCB 30 are facing down and not shown. In typical probe cards, the connectors 24 (typically zero insertion force (ZIF) connectors) provide connections located around the periphery of the probe card, and are configured to mate with connectors that are typically arranged in a similar fashion on the test head. Although illustrated as flexible cable ZIF connectors, other connector types may be used, such as pogo pins, non-ZIF flexible cable connectors, conductive elastomer bumps, stamped and formed spring elements, etc.

SUMMARY

In accordance with the present invention, an improved wafer test assembly is provided to allow the test head connection to the probe card to be flexible and reconfigurable. The probe card is further configured to better provide minimal trace lengths, and limit the support structure between a test head and wafer probes.

In accordance with the present invention, a test assembly includes multiple probe head space transformer substrates supported together like tiles with probe contacts on one side and connectors attached on an opposing side for connection to flexible cable connectors. Use of the tiled probe heads enables a greater manufacturing yield than one single larger probe head substrate. The present invention, however, can be used with monolithic (non-tiled) assemblies as well. The attached connectors enable use of a simplified support structure for leveling each probe head and less complex methods for leveling. The simple support structure applies to either single or tiled probe head embodiments.

In one embodiment flexible cables link the probe head directly to connectors on the test head. In another embodiment, the flexible cable connectors link the tiles to a test head interface PCB which routes lines to other connectors at the PCB periphery to enable mating with a conventional test head structure.

Elimination of the interposer is enabled by the use of ZIF connectors, or other type connectors with flexible cables, since similar electrical connection lines to the interposer are provided with flexibility so that the probe head can be moved for leveling relative to the wafer.

The PCB can further be eliminated in one embodiment with the test head modified to include connectors in its center as well as around its periphery. Elimination of the conventional PCB that serves to route lines horizontally, enables minimizing trace lengths as well as optimization of signal and power delivery paths.

The support structure in one embodiment includes leveling pins supported by retaining means attached to the space transformer tiles, enabling leveling by applying both push and pull forces. This leveling pin attachment structure enables use of minimal support structure, and provides for limited spacing between the space transformer tiles.

Repositionable connectors are provided between the test head and probe card using a test head interface frame supporting the connectors. The position of the test head connectors can then be changed depending on whether full or partial wafer contact is desired. Such repositioning allows for an optimum connector arrangement to minimize signal trace lengths in the probe card substrates, and further enables easier trace length matching. In one embodiment, the test head connectors are slidable on rails, or pluggable and unpluggable to be moved over a range of allowed positions. Mechanical stops provide for rapid location of the test head interface connectors to desired configurations.

BRIEF DESCRIPTION OF THE DRAWINGS

Further details of the present invention are explained with the help of the attached drawings in which:

FIGS. 9A–9B provide cross sectional views showing details of a further embodiment of the probe card structure for FIG. 7 using flexible cable connectors, enabling elimination of an interposer and the PCB;

FIGS. 10A–10D provide views showing alternative embodiments to the leveling pin configuration of FIG. 9B;

FIGS. 13A–13C show arrangements of flexible cable connectors for full or partial wafer testing;

FIGS. 14A–B show reconfigurable test head interfaces allowing easy reconfiguration for either partial, or full wafer testing;

DETAILED DESCRIPTION

Figure 5A:
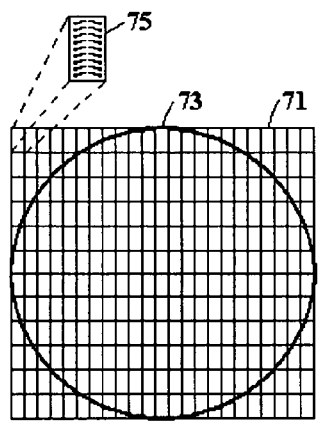
FIGS. 5A–5C show views illustrating how probe head substrates can be segmented.
Figure 5B:
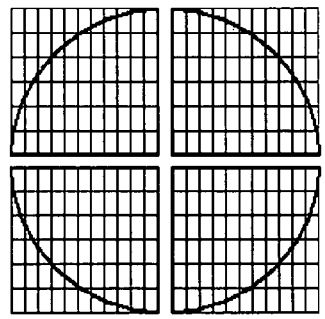
Figure 5C:
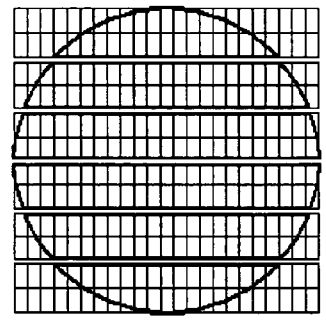

FIGS. 5A–5C illustrate how the probe head substrate can be segmented and arranged together as tiles in accordance with the present invention. FIG. 5A illustrates a substrate 71 over a wafer 73, where the substrate 71 that has not been segmented, while FIG. 5B illustrates a substrate segmented into quarters and FIG. 5C illustrates dividing a substrate into six parts. The substrates in FIGS. 5A–5C are further shown subdivided into device under test (DUT) sites each containing, for example, 10–200 probes for contacting corresponding pads or bumps of a single DUT on a wafer. A blowup of one DUT site 75 from substrate 71 of FIG. 5A shows a DUT site with eighteen contact elements.

The contact elements used may be spring probes, other contact elements for making electrical connections with DUTs on a wafer including without limitation needle probes, cobra style probes, buckling beam contacts, lithographically formed spring probes, elastomeric contacts, or rigid bumps, studs, posts, etc. Non-limiting examples of these probes include wirebond type spring probes made by wirebonding and plating as disclosed in U.S. Pat. No. 5,476,211, as well as lithographically formed probes disclosed in U.S. Pat. No. 6,482,013 and U.S. Pat. No. 6,268,015, which are incorporated by reference herein. Alternatively, the probe head contacts may be pads or terminals for making contact with raised elements on the DUT. Spring probes will be referenced in subsequent embodiments described, although other type DUT contacts may be used.

Segmenting the probe head substrate into quarters as shown in FIG. 5B, or sixths as shown in FIG. 5C allows a greater manufacturing yield since a single probe head substrate as shown in FIG. 5A with a faulty probe can require disposing of the entire probe head, while a segmented head shown in FIG. 5B or FIG. 5C will require only one faulty segment to be discarded. A similar improved manufacturing yield using segmented probe heads is described in U.S. Pat. No. 6,509,751, entitled "Planarizer For A Semiconductor Contactor," as well as U.S. patent application Ser. No. 09/527,931 entitled "Methods For Planarizing A Semiconductor Contactor, both incorporated herein by reference. The segmentation of FIGS. 5B and 5C allows a further manufacturing benefit since the sections are symmetrical, and any one faulty section can potentially be replaced by another. Larger segments further require a more complex structure for supporting and leveling each probe head, particularly since the larger substrates are more likely to flex in response to mounting or probe forces. Although FIGS. 5B and 5C show two possible segmentation schemes for a probe head substrate, many other possible segmentation schemes are possible.

Figure 6A:
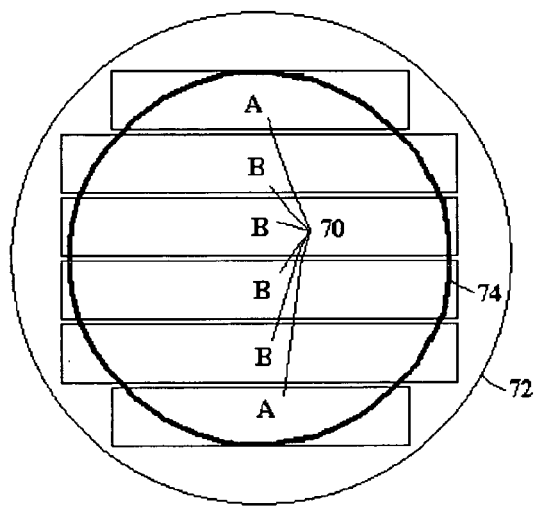
FIGS. 6A–6C show views illustrating segmented probe head substrates connected to either a single PCB, or to a segmented PCB.
Figure 6B:
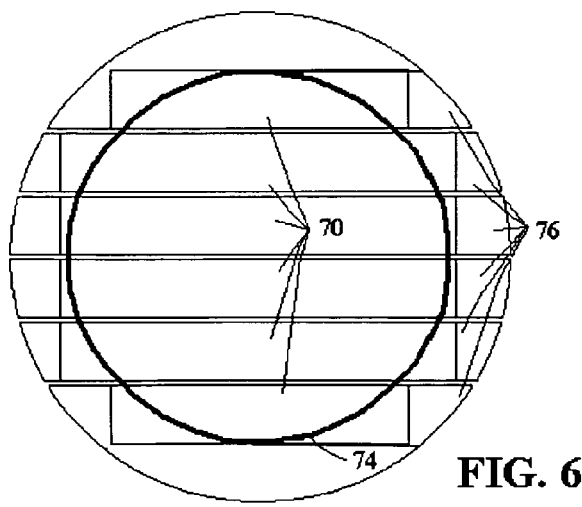
Figure 6C:
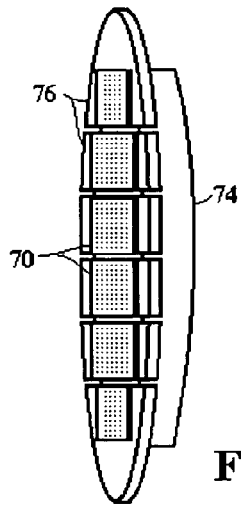

The segmented probe head substrates, as illustrated in FIGS. 5B and 5C, can be connected to a single PCB, or integrated with a segmented PCB, as illustrated in FIGS. 6A–6C. FIG. 6A is a top view illustrating substrates 70 segmented into six parts, with a single non-segmented PCB 72 and back plate 74, the back plate 74 having a size corresponding to a wafer being tested. FIG. 6B shows a top view illustrating the possibility of segmenting the PCB into separate parts 76, with the back plate 74 remaining as one unit providing support for both the PCB segments 76 and the probe head substrate segments 70. FIG. 6C for reference shows a perspective view of the segmented probe head substrate shown in FIG. 6B. As shown in FIG. 6C, a single backplate 74 supports the six PCB segments 76, which in turn support the probe head substrate segments 70 containing probes for contacting a wafer. FIGS. 6A–6C further illustrate that the probe segments 70 can be different sizes, the sections labeled A in FIG. 6A being smaller than the sections labeled B, as opposed to probe head segments being identical as shown in FIG. 5C.

Figure 7:
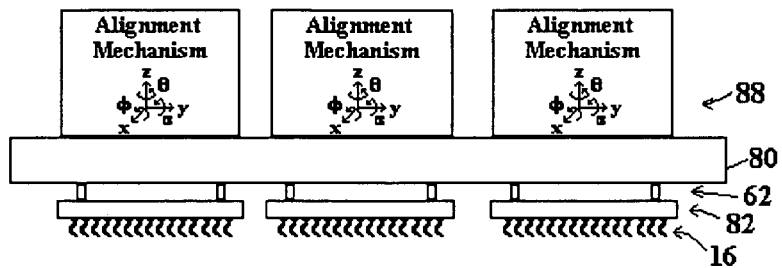
FIG. 7 is a cross sectional view illustrating generally structure for a probe card assembly with tiled space transformer substrates supporting test probes.

FIG. 7 shows a cross sectional view of a probe card assembly providing support for multiple tiled probe heads. The structure shown includes a single stiffener 80 supporting multiple tile structures 82. The tiles structures 82 can be incorporated with a segmented PCB, or a PCB can be provided as a single unit in combination with the stiffener 80, as illustrated in detail in FIGS. 8A–8B described to follow. Leveling pins 62 screwed through the stiffener 80 are provided to level the probe support substrates 82 relative to a wafer. Alignment mechanisms 88 are provided for adjusting the position of tiles 82 using leveling pins 62, the alignment mechanisms 88 providing up to six degrees of motion $\{x, y, z, \alpha, \theta, \phi\}$ separately for each tile.

Figure 1:
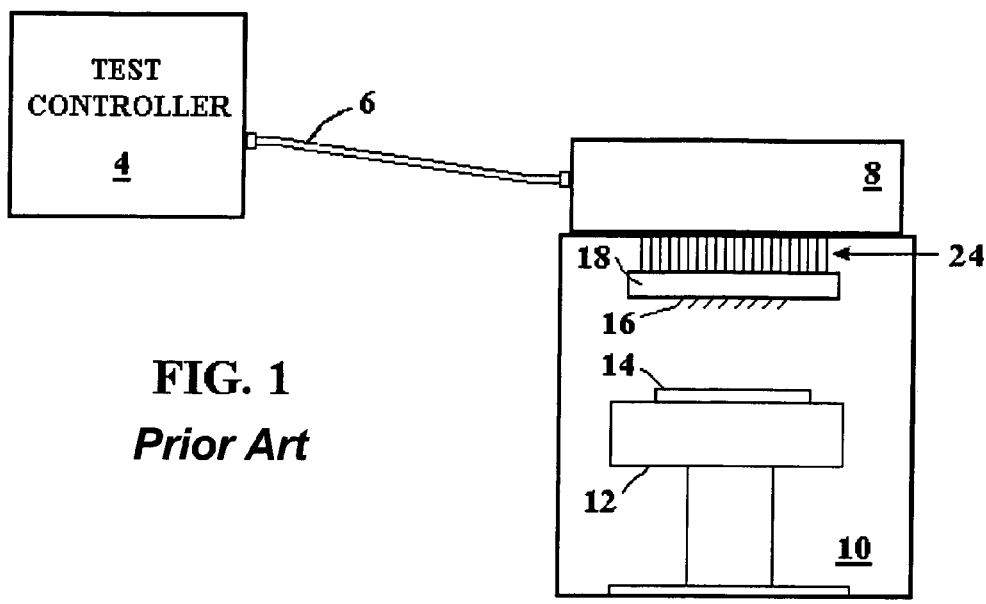
FIG. 1 shows a block diagram of components of a conventional wafer test system.
Figure 2:
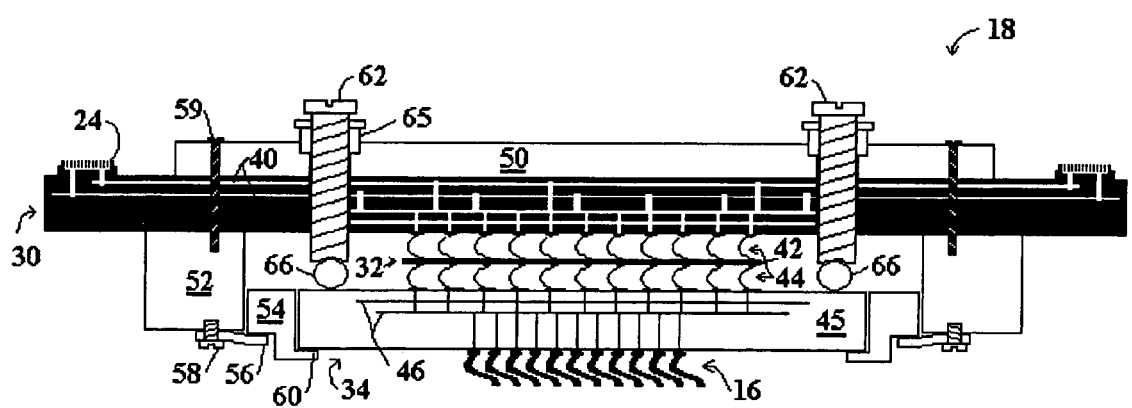
FIG. 2 is a cross sectional view of a conventional probe card for the wafer test system of FIG. 1.
Figure 3:
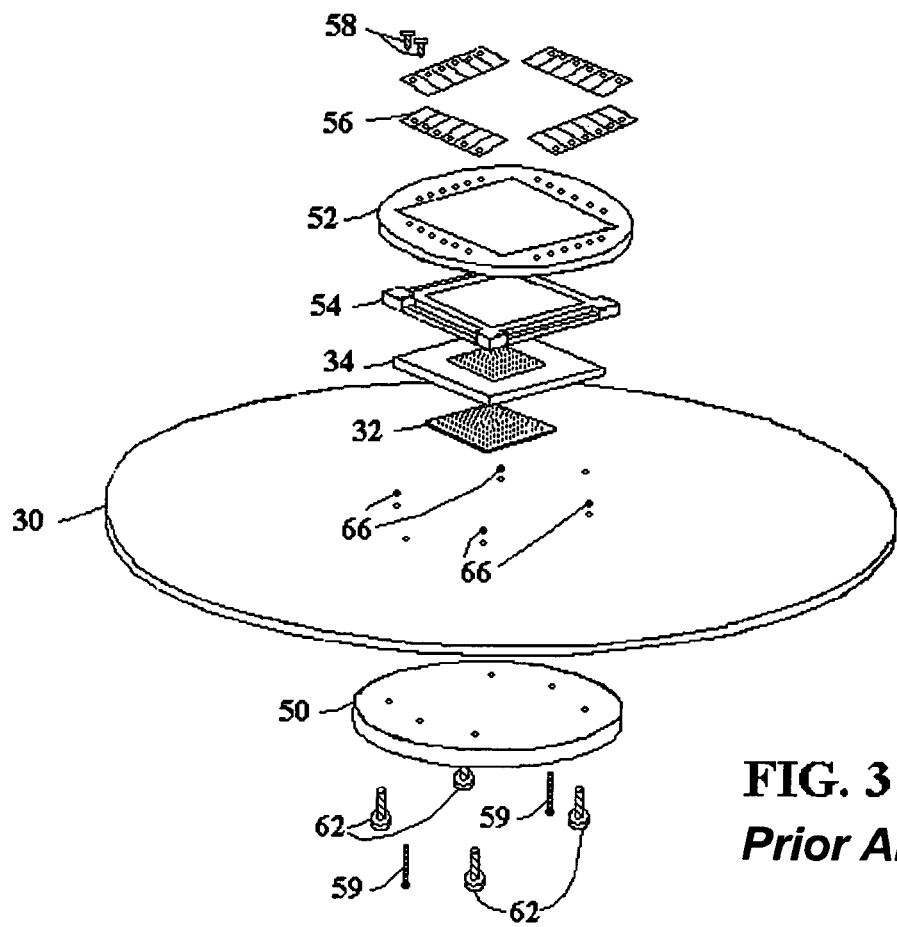
FIG. 3 is an exploded assembly view of components of the probe card of FIG. 2.
Figure 8A:
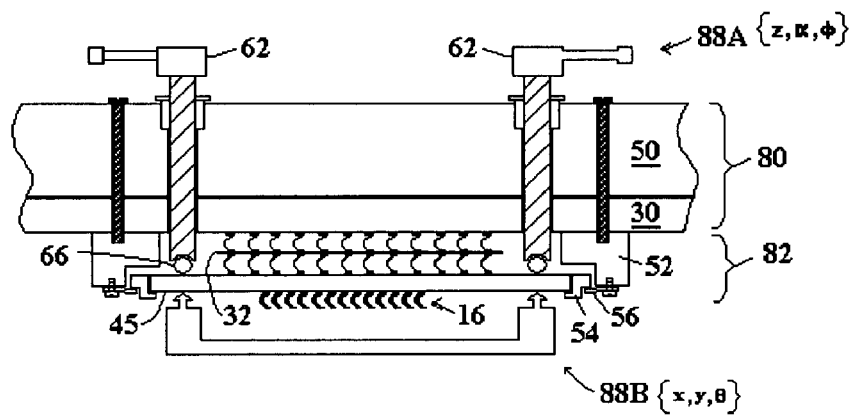
FIGS. 8A–8B show cross sectional views illustrating details of embodiments for the probe card assembly of FIG. 7 with tiled space transformer substrates and either a single PCB, or segmented PCBs.

FIG. 8A shows details of one embodiment for the probe card assembly of FIG. 7, showing tile structures 82 as supported by stiffener 80. In FIG. 8A the stiffener 80 is made up of the back plate 50 combined with a non-segmented PCB 30. The tile structure 82 includes a substrate 45 supporting probes 16, similar to FIG. 2, with a frame 54, a bracket 52, leaf springs 56 and an interposer 32. Leveling pins 62 are screwed through the back plate 50 and hold spheres 66 against the substrate 45 in combination with the leaf springs 56. For convenience, components carried over from FIG. 2 to FIG. 8A, as well as to FIG. 8B described below, are similarly labeled.

FIG. 8A further illustrates an embodiment of the alignment mechanism 88 to provide six degrees of motion using dual mechanisms labeled 88A and 88B. Rotation tools 88A are attached to enable adjusting the leveling screws 62, providing the three degrees of movement $(z, \alpha, \phi)$, as illustrated. An aligner 88B further allows an additional three degrees of movement $(x, y, \theta)$, as shown. The aligner 88B provides for horizontal movement by adjusting the substrate 45 within the frame 54 enabling the space transformer substrate 45 to move and rotate horizontally inside the frame 54. An alternative alignment mechanism allowing multiple degrees of motion is described in U.S. Pat. No. 6,509,751 and U.S. patent application Ser. No. 09/527,931, referenced previously.

Figure 8B:
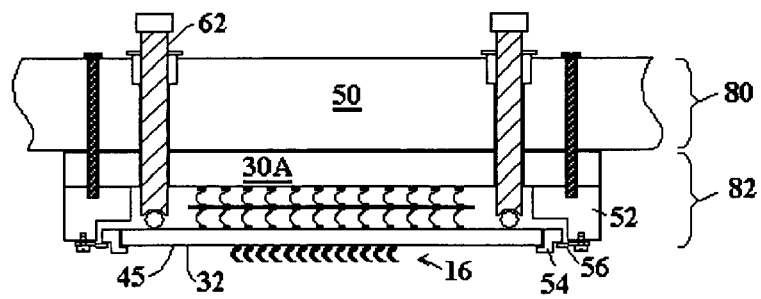

FIG. 8B shows details of another embodiment for the probe card assembly of FIG. 7. The components of FIG. 8B are similar to FIG. 8A, with the exception of the now segmented PCB portion labeled 30A. In FIG. 8B, the segmented substrate 45 is combined with the segmented PCB portion 30A to distinguish from the non-segmented PCB 30 of FIG. 8A, both PCB 30A and substrate 45 together forming the tile structure 82. The stiffener 80 is made up of the back plate portion 50, without the PCB.

FIG. 9A provides a cross sectional view showing details of a further embodiment of the probe card structure for FIG. 7 using flexible cable connectors 96, enabling elimination of an interposer 32 and the PCB 30 of FIGS. 8A–8B. FIG. 9A shows a test assembly with a probe head made up of a substrate 45 supporting probes 16 on one side, and one or more connectors 92 on the other side for connecting to a flexible cable connector 96. The tile structure 82 in FIG. 9A includes the substrate 45 as supported by a frame 54, bracket 56 and leaf springs 56, similar to the probe card assemblies of FIGS. 8A–8B. The flexible cable connector assembly 96 includes a flexible cable 95 with connectors 94 and 98. The connector 92 attached to substrate 45 mates with connector 94 forming part of the flexible cable connector 96. The flexible cable assemblies 96 can use a polyimide and copper flexible cable 95, or alternatively a twisted wire, a ribbon cable, or other cable assembly available in the art. The 80 stiffener is made up of a back plate with an opening 110 provided through which the flexible cable connector 96 passes enabling the flexible cable connector to be attached and removed after assembly of the probe head. Although flexible cable connectors are shown, other dematable connections with flexible routing lines can be used, including pogo pins, wires, or pressure connections to securely electrically connect to the probe head. Although these other connection types may be used, flexible cable connectors will be used to describe flexible cable connections referenced subsequently.

The connector 98 of flexible cable connector 96 in FIG. 9A can either mate directly to a corresponding connector of a test head (not shown), or can be connected indirectly through a test head interface 109, as illustrated in FIG. 9A, for routing to a test head connector. The test head interface 109 shown includes a PCB 115 with horizontal routing lines 113 provided from connector 112 to connector 114. Connector 112 is provided for connecting to connector 98 of the probe head assembly, while connector 114 connects to a corresponding test head connector (not shown). The test head interface 109 provides horizontal routing from probe head assemblies where the flexible cable connectors 96 of the probe card are not easily aligned with the test head connectors. Although shown with a test head interface 109, the test head interface may not be necessary with some horizontal routing provided in the substrate 45, as well as further space transformation provided by flexing of the cable 95 to horizontally route lines to the test head connectors.

Flexibility of the cable 95 further enables elimination of the interposer 32 of FIGS. 8A–8B. The flexibility of the cable 95 enables the probe head to be moved for leveling while maintaining electrical contact to the space transformer substrate 45. As with the configuration of FIGS. 8A–8B, in FIG. 9A to provide for leveling of the space transformer substrate 45, pins 62 are screwed through sleeves in the backplate 50. Gimble spheres 66 are provided between the leveling pins 62 and the substrate 45, as in previous configurations. Although not shown in FIG. 9A, a leveling mechanism can be included to provide six degrees of movement $\{x, y, z, \alpha, \theta, \phi\}$, such as by using the mechanism described with respect to FIG. 8A, or by providing flexure of the probe head by push-pull action as described in U.S. Pat. No. 6,509,751 and U.S. patent application Ser. No. 09/527,931, referenced previously.

FIG. 9B shows a probe card assembly with probe heads using flexible cable connectors 96 as in FIG. 9A, but with the probe card modified to include a space transformer leveling and support mechanism enabling multiple space transformer substrate tiles to be closely spaced together. A single backplate structure 50 is provided supporting at least two substrates $45_1$ and $45_2$, each substrate supporting probes 16. The leveling and support mechanism includes leveling pins $120_1$–$120_5$. Components for leveling and support attached to leveling pins $120_1$–$120_5$ are illustrated with respect to leveling pin $120_1$, and include nut 122, stud 124, and lock ring 126. The stud 124 is attached to the substrate $45_1$ and has screw threads extending from the substrate onto which the leveling pin $120_1$ is screwed. The leveling pin $120_1$ includes an opening tapped with screw threads onto which the stud 124 is screwed. The leveling pin $120_1$ further includes screw threads onto which the nut 122 is screwed. The nut 122 is turned to adjust the position of leveling pin $120_1$, which results in a z direction movement of substrate $45_1$. A locking cap 126 is screwed into the backplate 50 to secure the nut 122 by engaging a flange extending from the nut. Using the nut 122 secured with locking ring 126, both push and pull movement of the substrate $45_1$ is provided by turning the nut 122. This allows for z, $\alpha$, and $\phi$ adjustment.

The tile support mechanism of FIG. 9B provides for a close spacing of substrate tiles $45_1$ and $45_2$ by eliminating the need for the bracket 52, frame 54 and leaf springs 56 of FIG. 9A. The push-pull alignment mechanism provided by pins $120_1$–$120_5$ enables leveling and support, and further enables straightening of a bowed substrate tile, unlike the structure of FIG. 9A, providing only for pushing. For tile $45_1$, peripheral pins $120_1$ and $120_3$ are used for leveling, while a central pin $120_2$ is included to compensate for any bowing of the substrate tile $45_1$. A similar mechanism allowing compensation for bowing is described in U.S. Pat. No. 6,509,751 and U.S. patent application Ser. No. 09/527,931, referenced previously. Although the tile support mechanism of FIG. 9B is illustrated for use with multiple substrate tiles $45_1$ and $45_2$, it is contemplated that the advantages of this support mechanism can be provided with a probe card having only one tile.

FIGS. 10A–10D show alternative embodiments to the support mechanism configuration of FIG. 9B to similarly allow a close spacing of tiles in a probe card. The embodiment of FIG. 10A is an exploded assembly view showing that the studs 124 can be movably attached on a frame and secured with a clamping mechanism to enable alignment in the $\{x, y, \theta\}$ directions. The clamping mechanism is formed by a plate 127 and screw 125, in combination with a back plate separated into two parts $50_A$ and $50_B$. The screw 125 fits into the threads of plate $50_B$, but loosely fits through plate $50_A$ enabling the plate $50_A$ to move in the x and y directions as shown by the arrows relative to plate $50_B$ before the screw 125 is tightened. Similarly, the pin 120 is securely attached to plate $50_A$ by the retainer ring 126, but is free to move through plate $50_B$ so that the plate $50_A$ and substrate 45 are fixedly attached relative to each other, but may move in the x and y directions until the screw 125 is tightened.

A similar arrangement can be made to allow x-y plane using only a single back plate 50 by providing a lock ring 126 and nut 122 as illustrated in the cross sectional view of FIG. 10B. The lock ring 126 is made slightly larger, enabling the nut 122 to slide in the x and y plane as illustrated by the arrow, sliding occurring until the lock ring 126 is tightened. The opening for the leveling pin in backplate 50 is also made slightly larger to accommodate the x and y movement.

FIG. 10B further shows modification to the design of FIG. 9B by including a nut 132 in place of stud 124. The pin 130 is then modified from pin 120 to have external threads to allow screwing of the pin 130 into the nut 132. Although shown as a nut 132, since it is secured to the substrate 45 and does not need to turn it can be formed as a cylinder with internal threads for engaging the pin 130. The nut 122 and locking ring 126 are included, similar to the configuration FIG. 9B, to allow leveling by adjusting the nut 122.

In the embodiment of FIG. 10C, the configuration of FIG. 9B is modified by replacing stud 124 with a retaining element 136. The retaining element 136 is attached to the substrate 45 and has internal threads for screwing in a lock ring 138. The lock ring 138 engages a flange extending from the pin 134 to hold the flange within the retaining element 136. The flange of the pin 134 is able to rotate within the cavity formed between the retaining element 136 and lock ring 138. With rotation of the pin 134 possible, the pin 134 includes screw threads which are screwed through the back plate 50 for leveling of the substrate 45, rather than requiring a separate nut 122 for leveling, as in FIGS. 9B and 10A. Although the flange of the pin 134 is shown as being flat, it can be spherically shaped to more easily allow some horizontal motion of the pin 134 relative to the retaining element 136. Further embodiments of a support mechanism, similar to FIG. 9B, that can allow a close spacing of tiles in a probe card are disclosed in U.S. Pat. No. 6,509,751 and U.S. patent application Ser. No. 09/527,931, referenced previously.

FIG. 10D modifies the arrangement of FIG. 10C by adding a flexible section 180 to enable lateral movement of the support pin 134. In one embodiment 181, the flexible section 180 is formed by cutting one or more gaps in the support pin 134, enabling the support pin 134 to flex to move the substrate 45 laterally. In another embodiment 182, the flexible section 180 is formed from a stiff, yet flexible polymer insert. The polymer insert can be threaded and screwed into threaded sections of the support pin 134. The lateral movement provided by flexible section 180 can provide stress relief, as well as enabling some lateral movement of the substrate 45. Although shown with the arrangement of FIG. 10B, the flexible section 180 can be provided with other support pin arrangements in accordance with the present invention, including FIG. 10A or FIG. 9B.

Figure 11:
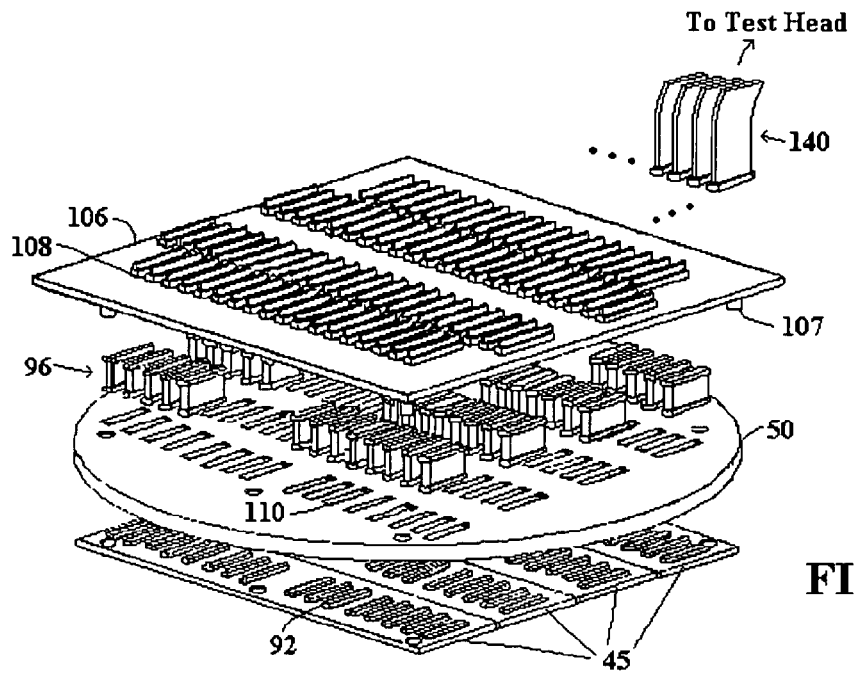
FIG. 11 shows a perspective view of a probe card assembly with flexible cable connectors shown in cross section in FIG. 9B, along with a test head interface.

FIG. 11 shows a perspective view of components of the probe card assembly with flexible cable connectors as shown in cross section in FIG. 9B, along with a test head interface. The perspective view shows the tiled substrates 45 supporting probes and connectors 92 for connecting to flexible cable connectors 96, a back plate 50, and a test head interface 106. The flexible cable connectors 96 are provided through openings 110 in the back plate 50 for connection on one end to the connectors 92 on the substrate, and on the other end to connectors (not shown) on the test head interface 106 with routing provided to connectors 108 on its opposing side. The test head interface 106 has alignment pins 107, enabling it to connect through holes in the back plate 50 and substrates 45, and to be spaced apart from the back plate 50 for clearance from support structure if necessary.

Four substrate tiles 45 are mounted using the single stiffener frame 50. Although shown spaced closely together, the substrate tiles 45 are separated to a degree necessary for the support structure. The support structure, although not shown in FIG. 11, can include either the support structure of FIG. 9B, or the frame and bracket shown in FIG. 9A. In one embodiment, the test head interface 106 can be a PCB with internal horizontal routing to provide for "space transformation" in the test head interface if necessary. In another embodiment, the test head interface can include a PCB with vertical feed through vias between connectors. Test head connectors 140 are shown for illustration, and include an array of flexible cable connectors 140 for connecting to corresponding connectors 108 of the test head interface 106.

Figure 12A:
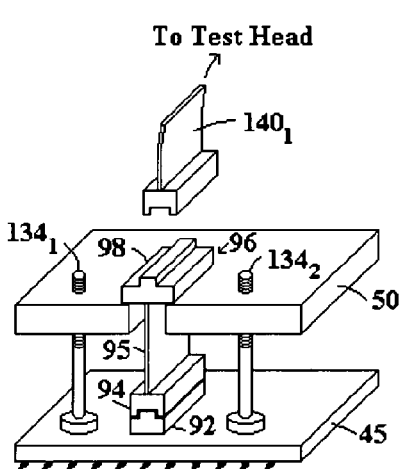
FIG. 12A illustrates the configuration of FIG. 11 used without the test head interface PCB.
Figure 12B:
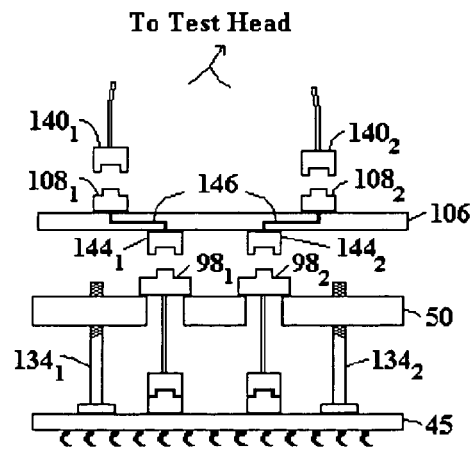
FIG. 12B illustrates the configuration of FIG. 11 with the test head interface PCB used to provide horizontal routing.
Figure 12C:
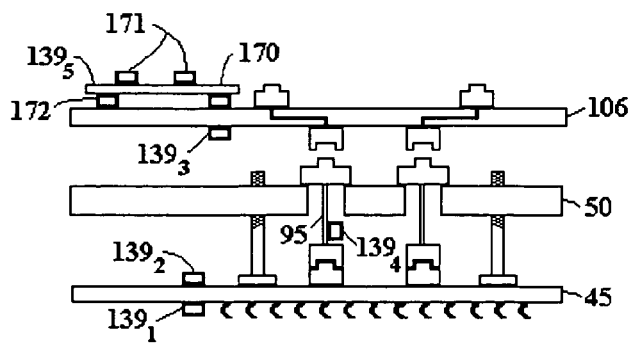
FIG. 12C illustrates attachment of components to surfaces of a probe card assembly and a test head interface PCB.

FIGS. 12A–C show details of the probe card configuration of FIG. 11 used with and without the test head interface PCB 106. A probe card without the test head interface PCB 106 is illustrated in FIG. 12A. The probe card shown includes a space transformer substrate 45 with leveling pins $134_1$ and $134_2$, as shown in FIG. 10C, with the leveling pins having screw threads for screwing through back plate 50. A connector 92 is attached to the substrate 45. A flexible cable connector 106 is composed of a connector 94 connected to the connector 92 on the substrate 45. The connector 106 also includes flexible cable 96 and a second connector 98. The second connector 98 is then supported by the back plate 50, and can be left either unattached to the back plate 50, or attached by a means such as an attachment pin or adhesive material. As shown, the connector 98 is then connected directly to a test head connector $140_1$, without an intervening test head interface.

A probe card used with a test head interface 106 is illustrated in FIG. 12B. The probe card shown includes a space transformer substrate 45 with leveling pins $134_1$ and $134_2$ having screw threads screwed through back plate 50. Two flexible cable connectors are further shown in FIG. 12B, similar to that of FIG. 12A, with connector ends $98_1$ and $98_2$ shown supported by the back plate 50. The test head interface PCB 106 is then shown supporting two connectors $144_1$ and $144_2$ to connect with the corresponding connectors $98_1$ and $98_2$. Routing lines 146 are then provided within the PCB 106 to provide both horizontal and vertical routing to connectors $108_1$ and $108_2$. The connectors $108_1$ and $108_2$ then mate with corresponding test head connectors $140_1$ and $140_2$. The routing lines 146 are shown providing horizontal routing to help make connection with a test head having a different connector spacing. However, such horizontal routing may not be necessary depending on design requirements.

FIG. 12C illustrates that components $139_{1-5}$ can be attached to surfaces of components of the probe card assembly and a test head interface PCB. To illustrate possible surfaces where components may be placed, components $139_1$ and $139_2$ are shown connected to opposing surfaces of a space transformer substrate 45, components $139_3$ and $139_5$ are shown connected to either surface of the test head interface PCB 106 (if such an interface is used as in FIG. 12B), and component $139_4$ is shown connected to the cable 95. The components attached can be discrete passive or active components, such as components $139_{1-4}$ including resistors, capacitors, voltage regulators, transistors, processors, or analog or mixed signal ICs mounted on the surfaces. The components can also include a separate daughter card, such as in component $139_5$ that includes a daughter card substrate 170 that supports multiple discrete components 171 connected by connectors 172 to the PCB 106, as shown. The components $139_{1-5}$ can be connected through one or more of substrates 106 and 45 and flexible cable 95 to internal signal or power supply lines.

Different test head interfaces, similar to 106, can be provided with routings differing to enable mating a single probe card configuration to multiple test head configurations with limited cost. In one arrangement, the test head interface 106 is arranged to include connectors around the periphery to roughly match the arrangement of connectors of FIG. 4 on a typical probe card for mating with a typical test head. However, by reconfiguring a typical test head interface to have connectors located in the center as well as around its periphery, roughly matching the arrangement shown in FIG. 11, the conventional PCB routing can be eliminated. With minimal or no line routing in a test head interface PCB, trace lengths are minimized and signal and power delivery paths are optimized.

With flexible cable connectors 96 used, in one embodiment of the present invention the test head connectors can be repositioned depending on whether a full or partial wafer contactor is desired. FIGS. 13A–C illustrate how test head flexible cable connectors can be reconfigured to rapidly allow either full or partial wafer testing. FIG. 13A illustrates a configuration of flexible cable connectors arranged for full wafer testing. FIG. 13B then shows the same connectors rearranged over a wafer to enable either partial wafer testing in a single step, or full wafer testing using multiple steps. FIG. 13C shows an alternative arrangement to FIG. 13B for both partial and full wafer testing. The hatched lines on connectors illustrate how test head connectors may be moved to go between the full wafer test arrangement of FIG. 13A to a partial test configuration in a manner that minimizes cable lengths and possibly tangling of the test head cables 140. In a first method illustrated by connectors 142 in step A FIG. 13B, one set of connectors has individual connectors moved apart to allow the hatched connectors to be inserted or interleaved between. In a second method illustrated by connectors 144 in step A of FIG. 13B, one set of connectors is split into two halves, while the other hatched set is inserted between the two halves. FIG. 13B shows a step A and step B, either of which can be used for partial wafer testing, but if full wafer testing is desired with a greater number of connectors than in FIG. 13A, testing can be performed in two steps, steps A and step B. FIG. 13C shows an alternative arrangement of connectors allowing for partial wafer testing in one step, or full wafer testing in two steps. The connectors are shown in FIG. 13C rearranged from FIG. 13A using arrangement 144, but can likewise be interleaved as in arrangement 142. Although two arrangement methods are shown, others may be used, such as interleaving in groups of two, three, etc. Similarly, although full wafer testing is shown provided in two steps, additional steps can be provided to test all DUTs in a larger wafer.

The capacity to easily change between a full or partial wafer test mode enables a test assembly to versatily test wafers having either a low number of DUTs per wafer, or a high number. As an example, assume a test head has DUT contacts to enable testing 1024 DUTs at a time. If a wafer has more than 1024 DUTs, the test will then be done in ½ wafer increments instead of a full wafer mode. With this arrangement, the configuration of FIG. 13A works for DUTs of less than 1024, while FIGS. 13A and 13B works for DUTs greater than 1024. Moving of the test head connectors to readily accommodate full, ½, ⅓ or ¼ wafer testing is desirable, as it can place the test and routing resources more directly over the DUTs so that routing lines in either configuration are shorter than a configuration with longer cables having connectors that are not reconfigurable.

FIGS. 14A–B illustrate how a test head connector arrangement that is reconfigurable to easily allow partial, or full wafer testing, or simply reconfiguration to fit different probe head connectors. In one embodiment shown in FIG. 14A, a test head connector support frame 145 includes holes 146 provided where pins 148 of the flexible connector 140 are inserted to secure the connector in various positions. Note that the pins 148 and holes 146 can be switched between the support frame 145 and flexible connectors 140 if desired. An opening 149 in the support frame 145 enables the flexible cable connector 140 to be moved to different positions. The connector is shown flexibly mating to either probe card connector $108_1$ or $108_2$, with the probe card configuration including a PCB as shown in FIG. 12B. The flexible cable connector 140 can alternatively mate to connectors 98 as shown in the configuration of FIG. 12A if a PCB is not used.

In a further alternative embodiment illustrated in FIG. 14B, the test head connector support frame 160 includes rails 162 on which corresponding sliders 164 on a flexible cable connector 140 are attached, enabling movement to different positions. Preferably components such as stops, detents or locking screws are used to enable reconfiguration to be accomplished quickly, and enable mating of test head connectors easily once reconfiguration is predictable. The use of stops 166 is illustrated in FIG. 14B.

Figure 4:
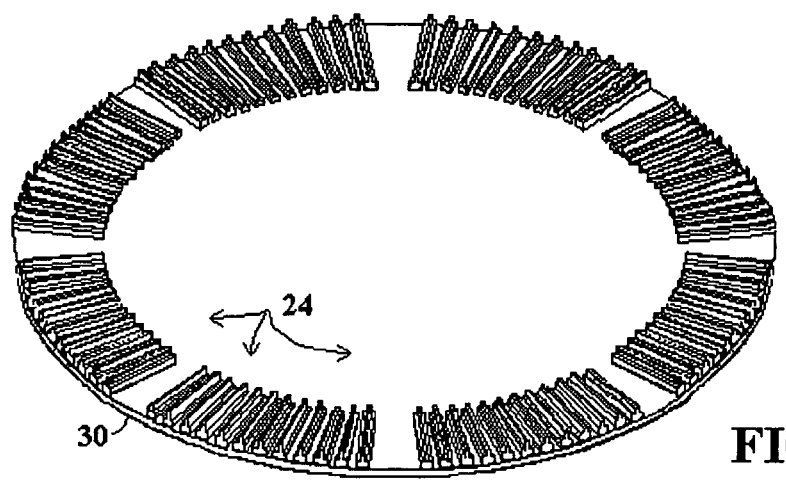
FIG. 4 is a perspective view of the PCB of FIG. 2 showing connectors for connecting to a test head.
Figure 15:
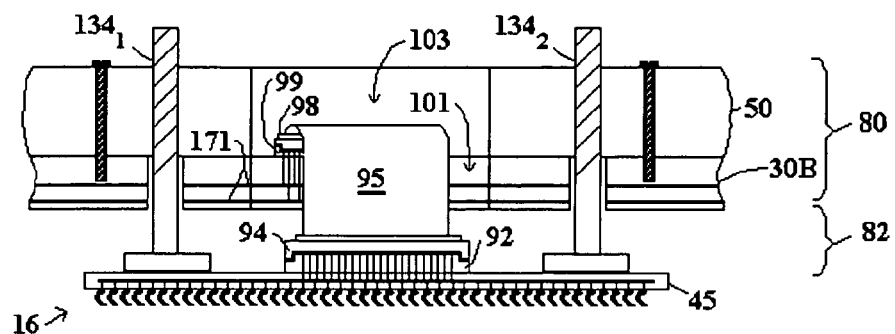
FIG. 15 shows a further embodiment of the support structure for a probe card assembly of FIG. 7 using flexible cable connectors connected to a test head interface PCB, the PCB routing signals to a conventional test head interface having connectors arranged around its periphery.

FIG. 15 shows a further embodiment of the support structure for a probe card assembly of FIG. 7 using flexible cable connectors connected to a test head interface PCB 30B, the PCB 30B routing signals to a conventional test head interface having connectors arranged around its periphery, similar to FIG. 4. FIG. 15 includes structural components of FIG. 12B with PCB 30B provided in combination with the back plate 50 to form the stiffener structure 80. In FIG. 15, a connector 98 is connected on one end to a connector 98 attached to PCB 30B, and an opening 101 is provided through the PCB 30B enabling the flexible cable 95 attached to connector 98 to pass through and flex so connector 98 can be attached to the PCB connector 99. Similarly, an enlarged opening 103 is provided in the back plate 50 for the flexible cable 95 and connectors 98 and 99 to connect. The PCB 30B further includes openings for support pins $134_1$–$134_2$ to pass through. A connector 94 on a second end of the flexible cable 95 connects to a connector 92 attached to the probe head substrate 45, enabling electrical connection of the probes 16 to the PCB 30B. Horizontal routing 171 is then provided in the PCB 30B to route signals from connector 99 to connectors 109 at the periphery of the PCB 30B, as illustrated in FIG. 16.

Figure 16:
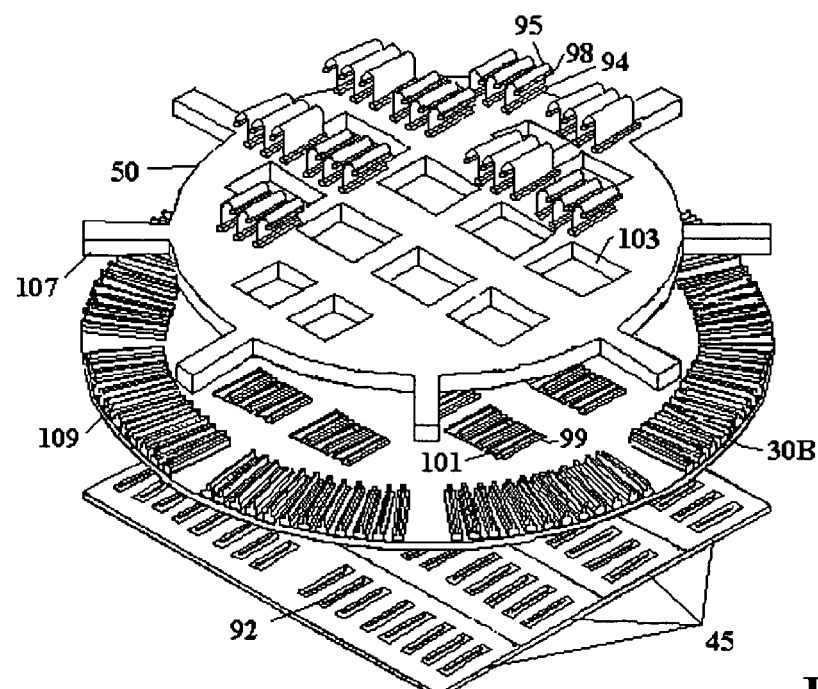
FIG. 16 shows a perspective view of a probe card assembly with flexible cable connectors as shown in cross section in FIG. 15.

FIG. 16 shows a perspective view of a probe card assembly with flexible cable connectors including a PCB 30B as shown in cross section in FIG. 15. The perspective view of FIG. 16 shows four segmented substrates 45 with connectors 92 for connecting to connectors 94 of flexible cable connectors (94–98). The PCB 30B includes connectors 99 for connecting to a second end 98 of the flexible cable connectors. The PCB 30B further includes openings 101 for the flexible cables 95 to pass through. The back plate 50 includes openings 103 enabling clearance for the flexible cable 95, cable connector 98 and PCB connector 99. The back plate 50 includes spoke extensions 107 providing additional stiffening and support for leveling pins if necessary. The spokes 107 provide clearance for connectors 109 around the periphery of the PCB 30B. The connectors 109 then mate with connectors around the periphery of a conventional test head. The PCB 30B then provides internal horizontal routing between connectors 99 and peripheral connectors 109. The potentially massive back plate 50 with spokes 107 manages stiffness, accounts for the coefficient of thermal expansion (CTE) matching between layers, and provides planarization advantages over conventional interposer and PCB architecture.

Although the present invention has been described above with particularity, this was merely to teach one of ordinary skill in the art how to make and use the invention. Many additional modifications will fall within the scope of the invention, as that scope is defined by the following claims.

What is claimed is:

1. A probe card assembly comprising:
   connections to a test head, the connections lying substantially over probe elements configured to contact a wafer;
   a backplate; and
   multiple substrates supporting the probe elements, the multiple substrates being attached to the backplate and repositionable relative to each other; and
   a test head interface PCB having first connectors on one side forming the test head connections and second connectors on the opposing side, with internal lines interconnecting the first connectors and the second connectors; and
   cable assemblies acting as flexible connections connecting electrically to the substrates supporting the probe elements on one end and to the second connectors of the test head interface on the other end.

2. The probe card assembly of claim 1, wherein the internal lines provided through a PCB comprise horizontal routing lines.

3. An assembly for testing a wafer comprising:
   a plurality of substrates each supporting probes to electrically contact pads on a wafer;
   a backplate attached to the substrates to support the substrates, wherein the substrates are repositionable relative to each other on the backplate;
   flexible cable connectors attached on a first end to the substrates opposite the probes to electrically connect to the probes; and
   a printed circuit board (PCB), the PCB having first connectors on one side to connect to a test head connector, the PCB further having electrical routing lines connecting second ends of the flexible cable connectors to second connectors on an opposing side of the PCB.

4. The assembly of claim 3, further comprising a daughter card attached to the PCB supporting discrete electrical components connected to the electrical routing lines of the PCB.

5. An assembly for testing a wafer comprising:
a substrate having a first side supporting contact elements configured to contact a wafer and having a second side with support members attached;
a backplate;
support pins provided through the backplate, and attached to the support members, the support pins being adjustable relative to the backplate to selectively apply a push or a pull force on the substrate; and
locking means for selectively locking and unlocking lateral movement of the substrate with respect to the backplate.

6. The assembly of claim 5, further comprising: nuts being screwed onto the support pins to adjust the support pins relative to the backplate; and means for rotatably attaching the nuts to the backplate.

7. The assembly of claim 5, wherein: the support pins are adjustable relative to the backplate by being screwed threw the backplate; and the support members engage the support pins, enabling the support pins to rotate within the support members while being adjusted relative to the backplate.

8. The assembly of claim 5, wherein while the locking means is unlocked, the substrate is freely moveable laterally with respect to the backplate, and while the locking means is locked, lateral movement of the substrate with respect to the backplate is restricted.

9. An assembly for testing a wafer comprising:
a substrate having a first side supporting contact elements configured to contact a wafer and having a second side with support members attached;
a backplate;
support pins provided through the backplate, and attached to the support members, the support pins being adjustable relative to the backplate to selectively apply a push or a pull force on the substrate; and
means to enable lateral positioning of the substrate, wherein the means to enable lateral positioning comprise:
a reference plate; and
a clamp comprising a clamping plate and screw to attach the backplate to the reference plate and allow the substrate to be moved laterally with the support pins relative to the reference plate, before the clamp secures the backplate.

10. The assembly of claim 9, wherein the means to enable lateral positioning comprise: locking rings provided around the support pins enabling the support pins to be moved laterally with the substrate before the locking rings secure the support pins.

11. The assembly of claim 9, wherein the means to enable lateral positioning comprises: gaps cut in the support pins enabling the support pins to bend to move the substrate laterally.

12. The assembly of claim 9, wherein the means to enable lateral positioning comprises: a flexible insert material provided in the support pins enabling the substrate to be moved laterally.

13. The assembly of claim 12, wherein the flexible insert material comprises a polymer that is screwed onto threaded portions of the support pins.

14. A tester interface comprising:
a substrate supporting probes;
flexible cable connectors electrically connectable on first ends to the substrate supporting probes, and having second ends for connecting to test head connectors; and
a frame attached to the substrate and movably supporting the first ends of the flexible cable connectors relative to the substrate so that the first ends of the flexible cable connectors are readily movable from a first position to at least one second position.

15. The tester interface of claim 14, wherein the first ends of the connectors are moved by rails attached to a frame.

16. The tester interface of claim 14, wherein the first ends of the connectors are located by plugs.

17. The assembly of claim 14, wherein in the first ends of the connectors are provided in:
a first position where all devices on a first wafer are tested in one touchdown of the plurality of substrates to the first wafer; and
a second position where all devices on a second wafer are tested in more than one touchdown of the plurality of substrates to the wafer.

18. The assembly of claim 14, wherein the test head connectors are pluggable into supports provided in said frame.

19. The assembly of claim 14, wherein the first ends of the connectors are arranged in pairs of rows in the first position, and wherein the connectors of the pairs of rows are repositioned to interleave connectors of pairs of rows to form single rows in the second position.

* * * * *